(12) United States Patent
Cho et al.

(10) Patent No.: US 7,729,175 B2
(45) Date of Patent: Jun. 1, 2010

(54) METHOD OF WRITING/READING DATA INTO/FROM MEMORY CELL AND PAGE BUFFER USING DIFFERENT CODES FOR WRITING AND READING OPERATIONS

(75) Inventors: Kyoung-lae Cho, Yongin-si (KR); Yoon-dong Park, Yongin-si (KR); Jun-jin Kong, Yongin-si (KR); Seung-hoon Lee, Seoul (KR); Jae-woong Hyun, Uijeongbu-si (KR); Sung-jae Byun, Yongin-si (KR); Ju-hee Park, Guri-si (KR); Seung-hwan Song, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 146 days.

(21) Appl. No.: 12/010,481

(22) Filed: Jan. 25, 2008

(65) Prior Publication Data
US 2008/0285352 A1 Nov. 20, 2008

(30) Foreign Application Priority Data
May 16, 2007 (KR) .................... 10-2007-0047831

(51) Int. Cl.
*G11C 11/34* (2006.01)
(52) U.S. Cl. ............................ 365/185.24; 365/185.04; 365/185.14

(58) Field of Classification Search ............ 365/185.24, 365/185.04, 189.14, 227, 185.14
See application file for complete search history.

(56) References Cited

U.S. PATENT DOCUMENTS

| | | | | |
|---|---|---|---|---|
| 6,529,405 | B2* | 3/2003 | Chang | 365/185.03 |
| 7,035,144 | B2* | 4/2006 | Kim et al. | 365/185.18 |
| 7,336,532 | B2* | 2/2008 | Chen | 365/185.03 |
| 7,359,248 | B2* | 4/2008 | Chen et al. | 365/185.22 |
| 7,529,127 | B2* | 5/2009 | Park et al. | 365/185.03 |

* cited by examiner

*Primary Examiner*—Pho M. Luu
(74) *Attorney, Agent, or Firm*—Harness, Dickey & Pierce, P.L.C.

(57) ABSTRACT

Provided are a method of writing/reading data into/from a memory cell and a page buffer using different codes for the writing and reading operations. The method of writing/reading data into/from a memory cell that has a plurality of threshold voltage distributions includes a data writing operation and a data reading operation. In the data writing operation, data having a plurality of bits is written into the memory cell by using a plurality of writing codes corresponding to threshold voltage distributions. In the data reading operation, the data having a plurality of bits is read from the memory cell by using reading codes corresponding to the threshold voltage distributions from among the threshold voltage distributions. In the method of writing/reading data into/from a memory cell, a part of the writing codes is different from a corresponding part of the reading codes.

19 Claims, 11 Drawing Sheets

| SECOND LATCH | THIRD LATCH BEFORE LOGIC OPERATION | THIRD LATCH AFTER LOGIC OPERATION |
|---|---|---|
| 0 | 0 | 0 |
| 1 | 0 | 1 |
| 1 | 1 | 0 |

METHOD OF WRITING/READING DATA INTO/FROM MEMORY CELL AND PAGE BUFFER USING DIFFERENT CODES FOR WRITING AND READING OPERATIONS

PRIORITY STATEMENT

This application claims the benefit of Korean Patent Application No. 10-2007-0047831, filed on May 16, 2007, in the Korean Intellectual Property Office, the disclosure of which is incorporated herein in its entirety by reference.

BACKGROUND

1. Field

Example embodiments relate to a method of writing/reading data into/from a memory cell and a page buffer. More particularly, example embodiments relate to a method of writing/reading data into/from a memory cell and a page buffer using different codes for writing and reading operations.

2. Description of the Related Art

Non-volatile memory devices, which can electrically erase and program data, generally preserve stored data even without a power supply. A representative example of a non-volatile memory device is a flash memory.

Memory cells of a flash memory are generally composed of cell transistors. Each cell transistor includes a control gate, a floating gate, a source, and a drain. A cell transistor of a flash memory can be programmed or erased using the Fowler-Nordheim (F-N) tunneling mechanism.

An erasing operation of the cell transistor may be performed by applying a ground voltage to the control gate of the cell transistor and applying a higher voltage than a source voltage to a semiconductor substrate (referred to herein as a bulk) of the cell transistor. During this erasing operation, a strong electric field is formed between the floating gate and the bulk due to a large voltage difference therebetween and thus, electrons stored in the floating gate are emitted to the bulk due to the F-N tunneling effect. Accordingly, a threshold voltage of the cell transistor is reduced.

A programming operation of the cell transistor may be performed by applying a higher voltage than the source voltage to the control gate and applying the ground voltage to the drain and bulk. During this programming operation, electrons are injected to the floating gate by the F-N tunneling effect. Accordingly, the threshold voltage of the programmed cell transistor is increased.

A mode in which electrons are injected to the floating gate is referred to as a programming mode, and a mode in which electrons are removed from the floating gate is referred to as an erasing mode. The threshold voltage of the programming mode may be greater than 0 volts and the threshold voltage of the erasing mode may be less than 0 volts.

Recently, research has been actively conducted on a multi-level flash memory which stores a plurality of data in a memory cell in order to further improve integration density of a flash memory. Multi-bit data including two or more bits may be stored in the memory cell of a multi-level flash memory. A memory cell storing multi-bit data is referred to as a multi-level memory cell while a memory cell storing a single bit is referred to as a single-level memory cell. Since a multi-level memory cell stores multi-bit data, the multi-level memory cell has four or more threshold voltage distributions, as well as four or more storage states of the data corresponding to the threshold voltage distributions. A conventional example of storing two-bit data in a multi-level memory cell of a multi-level flash memory is described below. However, three or more bit data may also be stored in the multi-level memory cell of a conventional multi-level flash memory.

A conventional multi-level memory cell may have a variety of threshold voltage distributions based on a number of storable bits. In the conventional example described below, the multi-level memory cell has four threshold voltage distributions. A conventional multi-level memory cell which stores four bits may have sixteen threshold voltage distributions, for example.

The threshold voltage distributions of the multi-level memory cell in this conventional example are mapped to corresponding codes which represent storage states of the data. For example, the four threshold voltage distributions may be mapped to four corresponding codes ('11', '10', '01', and '00') for representing two bits.

Writing and reading operations of the multi-level memory cell are performed by using the codes. In particular, the writing operation of the multi-level memory cell is performed by mapping a threshold voltage distribution of the multi-level memory cell to a code (e.g., '00'), which represents a storage state of written data. The reading operation of the multi-level memory cell is performed by checking the position of the threshold voltage distribution and reading the code (e.g., '00'), which is mapped to the checked threshold voltage distribution.

Conventionally, the writing and reading operations of a general memory cell are performed by using the same codes. For example, if codes of '11', '01', '00', and '10' are used for the writing operation, the same codes of '11', '01', '00', and '10' are also used for the reading operation.

If the codes optimized for the writing operation are used for the writing and reading operations, the number of reading operations has to be increased in order to check positions of the threshold voltage distributions during the reading operations. On the other hand, if the codes optimized for the reading operation are used for the writing and reading operations, threshold voltage variations increase in the writing operation.

SUMMARY

Example embodiments provide a method of writing/reading data into/from a memory cell using different codes for writing and reading operations.

Example embodiments provide a page buffer using different codes for writing and reading operations.

An example embodiment provides a method of writing/reading data into/from a memory cell that has a plurality of threshold voltage distributions within a voltage range. The method may include a data reading operation for reading data, which has a plurality of bits, from the memory cell with a plurality of reading codes corresponding to the plurality of threshold voltage distributions within the voltage range. A part of the reading codes are different from a corresponding part of writing codes used to write the data into the memory cell.

According to an example embodiment, the data reading operation may include a first reading operation for reading one bit from the data written in the memory cell based on a first threshold voltage being disposed in a middle of the voltage range; a second reading operation based on a second threshold voltage being disposed in a middle of a lower half of the voltage range and between voltage distributions of the lower half of the voltage range; a third reading operation based on a third threshold voltage being disposed in a middle of an upper half of the voltage range and between voltage distributions of the upper half of the voltage range; and a logic operation for obtaining another bit from the data written in the memory cell by performing a logic operation on results from the second reading operation and the third reading operation.

Another example embodiment provides a page buffer of a semiconductor device which writes/reads data, which has a plurality of bits, into/from one or more memory cells each storing the data and having a plurality of threshold voltage distributions within a voltage range. The page buffer may include a first latch for storing one bit of the plurality of bits of the data read from a memory cell with reference to a first threshold voltage disposed in the middle of the voltage range; a first storing component for storing a result of reading from the memory cell with reference to a second threshold voltage disposed in a lower half of the voltage range and between threshold voltage distributions; a second storing component latch for storing a result of reading from the memory cell with reference to a third threshold voltage disposed in an upper half of the voltage range and between threshold voltage distributions; and a logic operation unit for obtaining another bit of the data by performing a logic operation on results stored in the second latch and the third latch. The second threshold voltage is lower than the first threshold voltage, and the third threshold voltage being higher than the first threshold voltage.

BRIEF DESCRIPTION OF THE DRAWINGS

The above and other features and advantages of example embodiments will become more apparent by reviewing the detailed description of example embodiments of this disclosure in connection with the attached drawings in which.

DETAILED DESCRIPTION OF EXAMPLE EMBODIMENTS

Figure 1A:
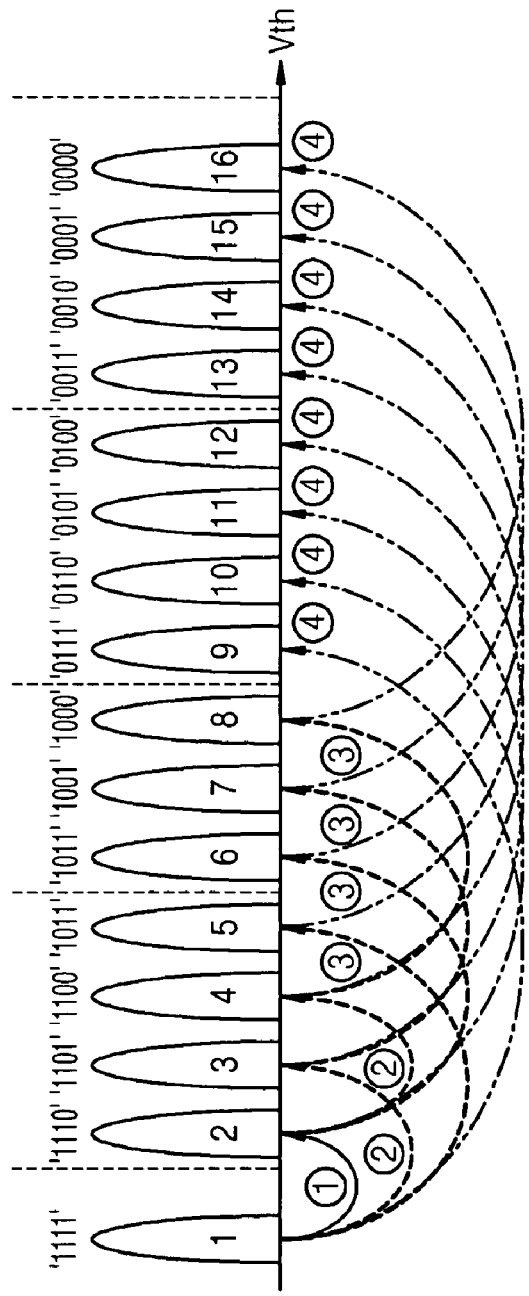
FIG. 1A is an example diagram illustrating a writing operation using binary codes.

Various example embodiments are described more fully below with reference to the accompanying drawings. However, specific structural and functional details disclosed herein are merely representative for purposes of describing example embodiments, and one skilled in the art will appreciate that example embodiments may be embodied in many alternate forms and should not be construed as limited to only the embodiments set forth herein.

It should be understood that, although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a similar fashion (e.g., "between" versus "directly between", "adjacent" versus "directly adjacent", etc.).

The terminology used herein is for the purpose of describing example embodiments only and is not intended to be limiting of the example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Example embodiments described below with respect to the drawings are provided so that this disclosure will be thorough, complete and fully convey the concept of example embodiments to those skilled in the art. In the drawings, like numbers refer to like elements throughout.

Hereinafter, example embodiments are described in detail with reference to the attached drawings.

Threshold voltage distributions of a multi-level memory cell may be mapped to codes (storage states of data) using a variety of methods. For example, if four threshold voltage distributions are to be mapped, codes '11', '01', '00', and '10' can be mapped to the threshold voltage distributions within an operating voltage range of the multi-level memory cell. The threshold voltage distributions may be mapped from the threshold voltage distribution having the lowest threshold value to the threshold voltage distribution having the highest threshold value. As another example, codes '10', '01', '11', and '00' can be mapped to the threshold voltage distributions from the threshold voltage distribution having the lowest threshold value to the threshold voltage distribution having the highest threshold value.

Writing and reading operations using binary codes and gray codes are described below with reference to FIGS. 1A and 1B, and 2A and 2B.

Figure 1B:
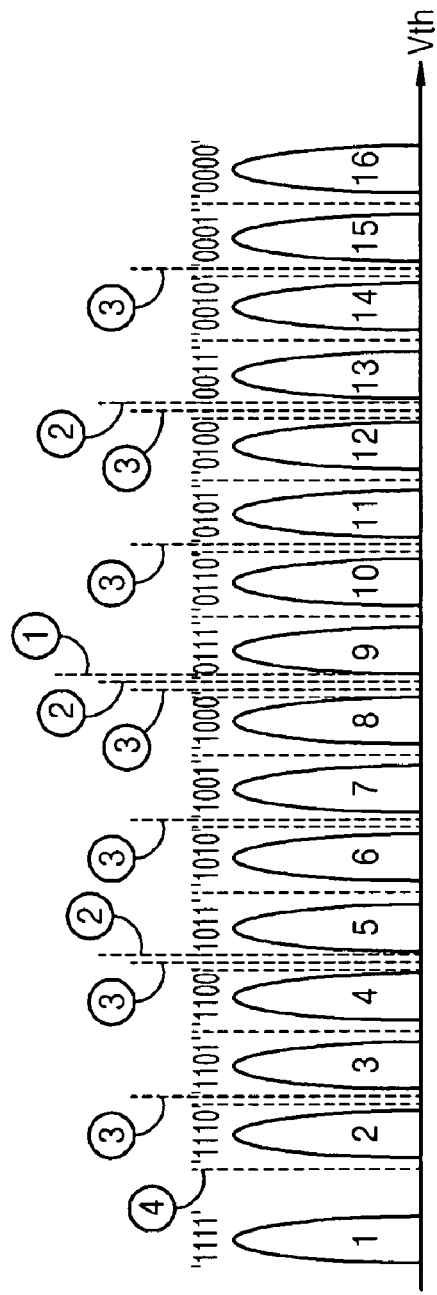
FIG. 1B is an example diagram illustrating a reading operation using binary codes.
Figure 2A:
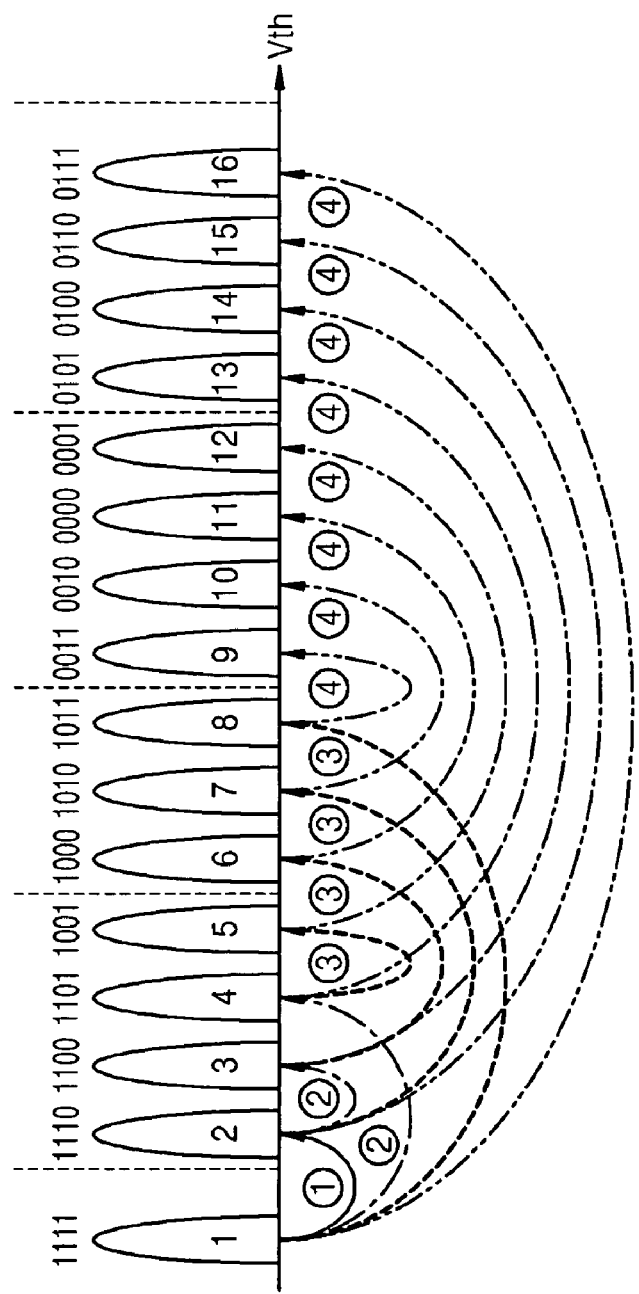
FIG. 2A is an example diagram illustrating a writing operation using gray codes.
Figure 2B:
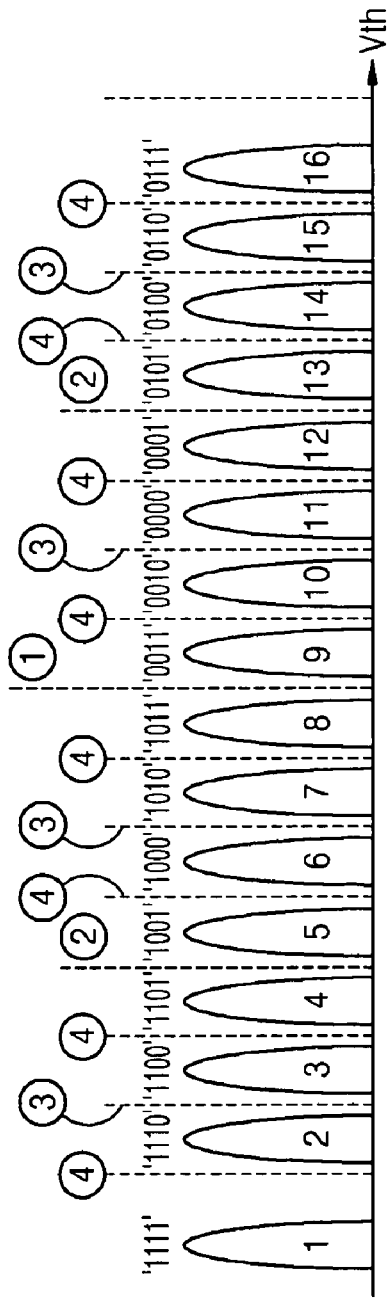
FIG. 2B is an example diagram illustrating a reading operation using gray codes.

In the writing and reading operations using the binary codes, threshold voltage distributions are mapped to the corresponding binary codes as illustrated in FIGS. 1A and 1B. In the writing and reading operations using the gray codes, the threshold voltage distributions are mapped to the corresponding gray codes as illustrated in FIGS. 2A and 2B.

FIG. 1A is an example diagram illustrating a writing operation using binary codes.

In a first writing operation ① of FIG. 1A, a first bit is written into a memory cell. The first bit may be the least significant bit written into the memory cell. In the example of FIG. 1A, if the first bit is '0', the memory cell is written by a second threshold voltage distribution, and if the first bit is '1', the memory cell is maintained by a first threshold voltage distribution.

In a second writing operation ② of FIG. 1A, a second bit is written into the memory cell. For example, if the first bit is '0', that is, the memory cell was written by the second threshold voltage distribution in the first writing operation ①, and the second bit is '0', the memory cell is written by a fourth threshold voltage distribution. If the first bit is '0' and the second bit is '1', the memory cell is maintained by the second threshold voltage distribution. Also, if the first bit is '1', that is, the memory cell was maintained by the first threshold voltage distribution in the first writing operation ① and the second bit is '0', the memory cell is written by a third threshold voltage distribution. If the first bit is '1' and the second bit is '1', the memory cell is maintained by the first threshold voltage distribution.

In a third writing operation ③ of FIG. 1A, which writes a third bit into the memory cell based on the results of the first and second writing operations ① and ②, first and fifth threshold voltage distributions, second and sixth threshold voltage distributions, third and seventh threshold voltage distributions, or fourth and eighth threshold voltage distributions are used.

In a fourth writing operation ④ of FIG. 1A, which writes a fourth bit into the memory cell based on the results of the first, second, and third writing operations ①, ②, and ③, first and ninth threshold voltage distributions, second and tenth threshold voltage distributions, third and eleventh threshold voltage distributions, fourth and twelfth threshold voltage distributions, fifth and thirteenth threshold voltage distributions, sixth and fourteenth threshold voltage distributions, seventh and fifteenth threshold voltage distributions, or eighth and sixteenth threshold voltage distributions are used.

FIG. 1B is an example diagram illustrating a reading operation using binary codes.

Four-bit data is read from a memory cell by sequentially performing first, second, third, and fourth reading operations ①, ②, ③, and ④ of FIG. 1B.

Referring to FIG. 1B, one reading action is performed in the first reading operation ①, three reading actions are performed in the second reading operation ②, seven reading actions are performed in the third reading operation ③, and fifteen reading actions are performed in the fourth reading operation ④. As a result, if the binary codes are used, a total of twenty six reading actions are performed in order to read the four-bit data from the memory cell.

FIG. 2A is an example diagram illustrating a writing operation using gray codes.

In a first writing operation ① of FIG. 2A, a first bit is written into a memory cell. The first bit may be the least significant bit written into the memory cell. In the example of FIG. 2A, if the first bit is '0', the memory cell is written by a second threshold voltage distribution, and if the first bit is '1', the memory cell is maintained by a first threshold voltage distribution.

In a second writing operation ② of FIG. 2A, a second bit is written into the memory cell. For example, if the first bit is '0', that is, the memory cell was written by the second threshold voltage distribution in the first writing operation ①, and the second bit is '0', the memory cell is written by a third threshold voltage distribution. If the first bit is '0' and the second bit is '1', the memory cell is maintained by the second threshold voltage distribution. Also, if the first bit is '1', that is, the memory cell was maintained by the first threshold voltage distribution in the first writing operation ①, and the second bit is '0', the memory cell is written by a fourth threshold voltage distribution. If the first bit is '1' and the second bit is '1', the memory cell is maintained by the first threshold voltage distribution.

In a third writing operation ③ of FIG. 2A, which writes a third bit into the memory cell based on the results of the first and second writing operations ① and ②, first and eighth threshold voltage distributions, second and seventh threshold voltage distributions, third and sixth threshold voltage distributions, or fourth and fifth threshold voltage distributions are used.

In a fourth writing operation ④ of FIG. 2A, which writes a fourth bit into the memory cell based on the results of the first, second, and third writing operations ①, ②, and ③, first and sixteenth threshold voltage distributions, second and fifteenth threshold voltage distributions, third and fourteenth threshold voltage distributions, fourth and thirteenth threshold voltage distributions, fifth and twelfth threshold voltage distributions, sixth and eleventh threshold voltage distributions, seventh and tenth threshold voltage distributions, or eighth and ninth threshold voltage distributions are used.

FIG. 2B is an example diagram illustrating a reading operation using gray codes.

Four-bit data is read from a memory cell by sequentially performing first, second, third, and fourth reading operations ①, ②, ③, and ④ of FIG. 2B.

Referring to FIG. 2B, one reading action is performed in the first reading operation ①, two reading actions are performed in the second reading operation ②, four reading actions are performed in the third reading operation ③, and eight reading actions are performed in the fourth reading operation ④. As a result, if the gray codes are used, a total of fifteen reading actions are performed in order to read the four-bit data from the memory cell.

The difference between the writing operations using the binary codes and the gray codes is described below.

Referring to FIGS. 1A and 2A, if the binary codes are used, threshold voltage variations of the fourth writing operation ④ of FIG. 1A are regular, whereas if the gray codes are used, the threshold voltage variations of the fourth writing operation ④ of FIG. 2A are not uniform and can be very large.

If a threshold voltage of a current memory cell to be written is changed, a coupling effect is generated in neighboring memory cells of the current memory cell. Accordingly, threshold voltages of the neighboring memory cells may be changed. In particular, the coupling effect between neighboring cells generally increases as the threshold voltage variations of the fourth writing operation ④ become larger. Therefore, when the gray codes are used as described with respect to FIG. 2A, the coupling effect is more pronounced than when the binary codes are used as described with respect to FIG. 1A.

The difference between the reading operations using the binary codes and the gray codes is described below.

As described above with reference to FIGS. 1B and 2B, if the binary codes are used to read the four-bit data from the memory cell, twenty six reading actions are used and/or required. However, if the gray codes are used to read the four-bit data from the memory cell, fifteen reading actions are used and/or required. Therefore, more reading actions are generally required when the binary codes as compared with when the gray codes are used.

Figure 3:
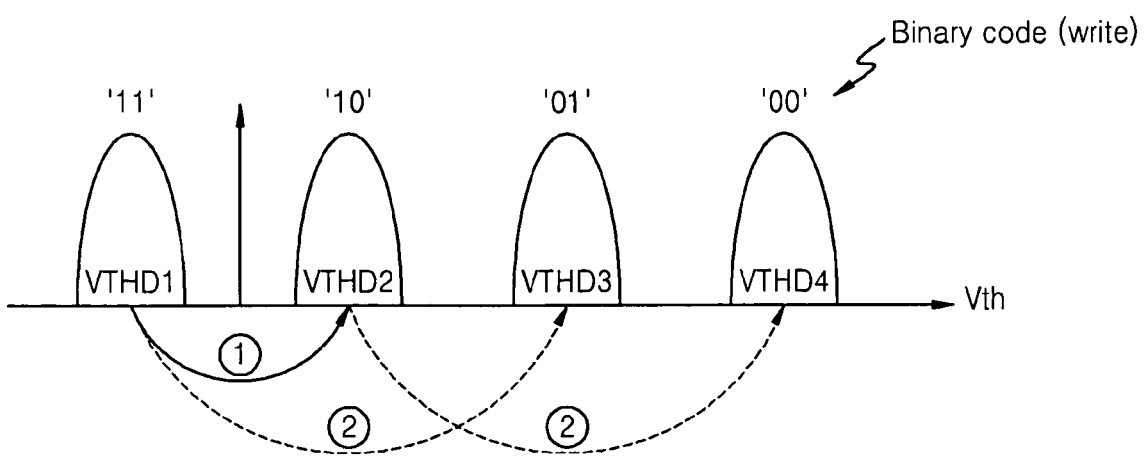
FIG. 3 is an example diagram illustrating a writing operation of an example embodiment of a method for writing/reading data into/from a memory cell.

FIG. 3 is an example diagram illustrating a writing operation of an example embodiment of a method for writing/reading data into/from a memory cell.

Referring to FIG. 3, an example embodiment of a writing operation is performed using binary codes. That is, first through fourth threshold voltage distributions VTHD1 through VTHD4 of the memory cell are mapped to corresponding binary codes '11', '10', '01', and '00'. Accordingly, in order to write data '11', '10', '01', and '00', the memory cell is written by the first through fourth threshold voltage distributions VTHD1 through VTHD4, respectively.

In a first writing operation ① of FIG. 3A, a first bit is written into a memory cell. The first bit may be the least significant bit written into the memory cell. As shown in FIG. 3A, the first and second threshold voltage distributions VTHD1 and VTHD2 are used to write the first bit. For example, if the first bit is '0', the memory cell is written by the second threshold voltage distribution VTHD2, and if the first bit is '1', the memory cell is maintained by the first threshold voltage distribution VTHD1.

In a second writing operation ② of FIG. 3A, a second bit is written into the memory cell based on the result of the first writing operation ①. The first and third threshold voltage distributions VTHD1 and VTHD3, or the second and fourth threshold voltage distributions VTHD2 and VTHD4 are used to write the second bit. For example, if the first bit is '0', that is, the memory cell was written by the second threshold voltage distribution VTHD2 in the first writing operation ①, and the second bit is '0', the memory cell is written by the fourth threshold voltage distribution VTHD4. If the first bit is '0' and the second bit is '1', the memory cell is maintained by the second threshold voltage distribution VTHD2. Also, if the first bit is '1', that is, the memory cell was maintained by the first threshold voltage distribution VTHD1 in the first writing operation ①, and the second bit is '0', the memory cell is written by a third threshold voltage distribution VTHD3. If the first bit is '1' and the second bit is '1', the memory cell is maintained by the first threshold voltage distribution VTHD1.

Figure 4:
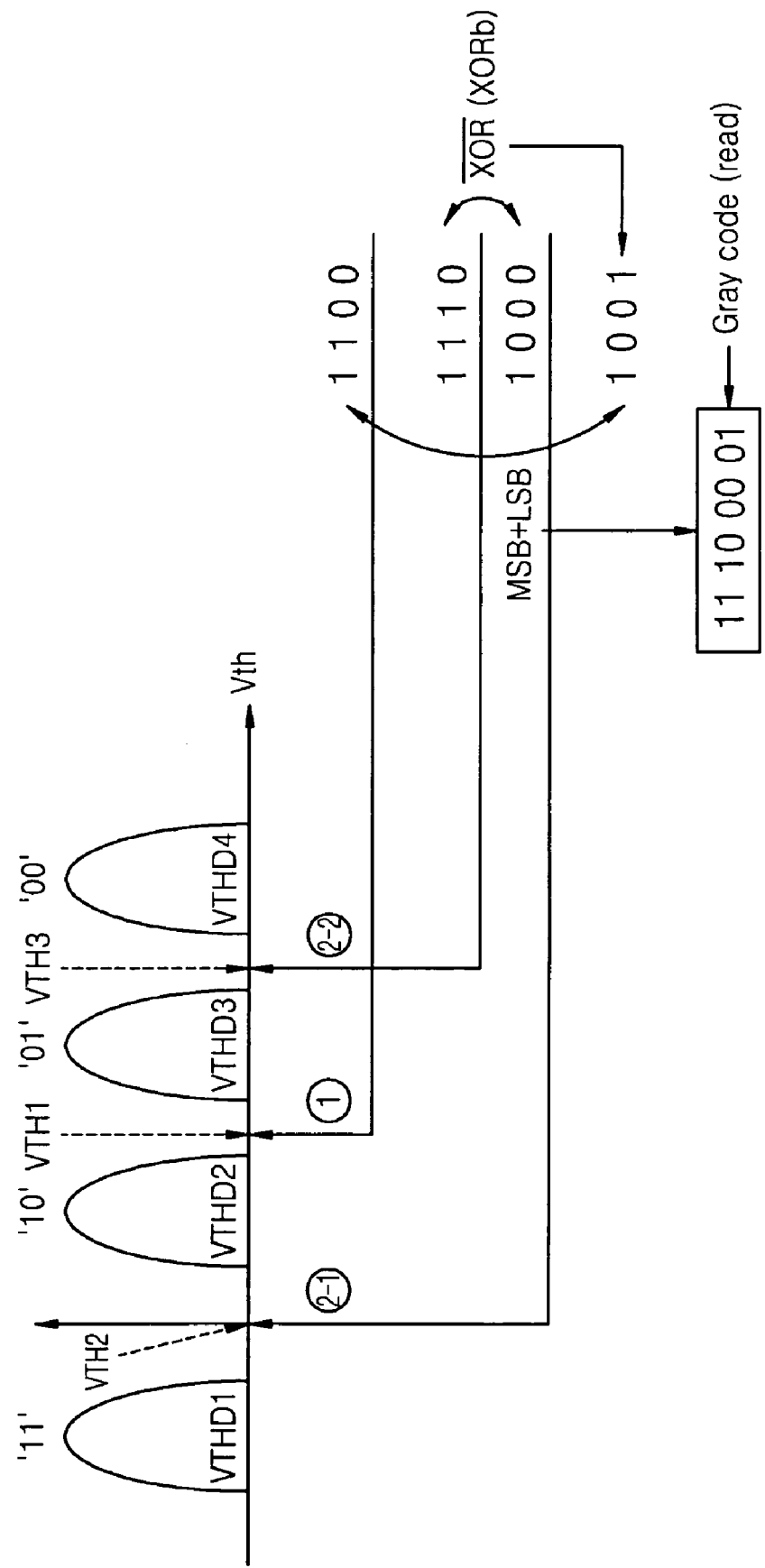
FIG. 4 is an example diagram illustrating a reading operation of an example embodiment of a method of writing/reading data into/from a memory cell.

FIG. 4 is an example diagram illustrating a reading operation of an example embodiment of a method for writing/reading data into/from a memory cell.

Referring to FIG. 4, the memory cell is written using binary codes. That is, as described in FIG. 3, when written data is '11', '10', '01', and '00', the memory cell is written by first through fourth threshold voltage distributions VTHD1 through VTHD4, respectively.

However, according to an example embodiment, although the memory cell is written using binary codes, the reading operation is performed using gray codes by assuming that the memory cell is written using the gray codes. That is, writing codes used for the writing operation and reading codes used for the reading operation are different from each other according to an example embodiment. Thus, codes separately optimized for the writing and reading operations may be used.

Referring to FIG. 4, the reading operation according to an example embodiment includes a first reading operation ①, first and second operations of a second reading operation, and a logic operation XORb. The first reading operation ① is performed from the memory cell with reference to a first threshold voltage VTH1, which is disposed between second and third threshold voltage distributions VTHD2 and VTHD3 and in the middle of first through fourth threshold voltage distributions VTHD1 through VTHD4. In FIG. 4, the first through fourth threshold voltage distributions VTHD1 through VTHD4 are considered the voltage range. Stated differently, the first threshold voltage VTH1 is disposed in the middle of the voltage range and between the second voltage distribution VTHD2 and the third voltage distribution VTHD3. As such, one bit, for example, the most significant bit is read from the memory cell from among n bits of the written data. For example, if the memory cell is written by the first threshold voltage distribution VTHD1 or the second threshold voltage distribution VTHD2, when the first reading operation ① is performed with reference to the first threshold voltage VTH1, '1' is read from the memory cell. On the other hand, if the memory cell is written by the third threshold voltage distribution VTHD3 or the fourth threshold voltage distribution VTHD4, '0' is read from the memory cell. The result of the first reading operation ① represents the most significant bit of the written data of the memory cell according to this example.

Referring to FIG. 4, the first operation of the second reading operation is performed from the memory cell with reference to a second threshold voltage VTH2, which is disposed between the first and second threshold voltage distributions VTHD1 and VTHD2. The second threshold voltage VTH2 is lower than the first threshold voltage VTH1. Stated differently, the second threshold voltage VTH2 is disposed in the middle of a lower half of the voltage range and between the first voltage distribution VTHD1 and the second voltage distribution VTHD2. For example, if the memory cell is written by the first threshold voltage distribution VTHD1, when the first operation of the second reading operation is performed with reference to the second threshold voltage VTH2, '1' is read from the memory cell. On the other hand, if the memory cell is written by the second threshold voltage distribution VTHD2, the third threshold voltage distribution VTHD3, or the fourth threshold voltage distribution VTHD4, '0' is read from the memory cell.

Still referring to FIG. 4, the second operation of the second reading operation is performed from the memory cell with reference to a third threshold voltage VTH3, which is disposed between the third and fourth threshold voltage distributions VTHD3 and VTHD4. The third threshold voltage VTH3 is higher than the first threshold voltage VTH1. Stated differently, the third threshold voltage VTH3 is disposed in the middle of an upper half of the voltage range and between the third voltage distribution VTHD3 and the fourth voltage distribution VTHD4. For example, if the memory cell is written by the first threshold voltage distribution VTHD1, the second threshold voltage distribution VTHD2, or the third threshold voltage distribution VTHD3, when the second operation of the second reading operation is performed with reference to the third threshold voltage VTH3, '1' is read from the memory cell. On the other hand, if the memory cell is written by the fourth threshold voltage distribution VTHD4, '0' is read from the memory cell.

In the logic operation XORb, a logic operation is performed on the results of reading obtained with reference to the second and third threshold voltages VTH2 and VTH3. In the example embodiment of FIG. 4, a logic operation is performed on '1000' obtained with reference to the second threshold voltage VTH2 and '1110' obtained with reference to the third threshold voltage VTH3. For example, an inverse exclusive or (XORb) operation is performed on '1000' and '1110', thereby generating '1001'. The result of the logic operation XORb may be another bit, for example, the second most significant bit, from among the n bits of the written data of the memory cell.

According to an example embodiment, the written data may be read from the memory cell by combining the one bit obtained by the first reading operation ① and the other bit obtained by the logic operation XORb. The one bit obtained by the first reading operation ① is latched and the latched bit and the other bit obtained by the logic operation XORb may be output together.

A reading operation according to an example embodiment is performed by assuming that the memory cell is written using the gray codes, and the results of the reading operation are represented by the gray codes. However, as described with respect to FIG. 3, the memory cell is actually written using binary codes according to an example embodiment. Therefore, the results of the reading obtained by using the gray codes (e.g., the reading codes) may be converted into the results of reading obtained by using the binary codes (e.g., the writing codes) according to an example embodiment. For example, the results of reading, such as '11', '10', '00', and '0', obtained by using the gray codes have to be converted into the results of reading, such as '11', '10', '01', and '00', obtained by using the binary codes. The converting may be performed by an external controller of a page buffer or by the page buffer according to an example embodiment.

For the convenience of explanation, in the example embodiment described above, the writing and reading operations are described assuming that the writing and reading codes are the binary and gray codes, respectively. However, according to an example embodiment, the writing codes may be any codes that reduce and/or minimize threshold voltage variations for writing data into a memory cell and the reading codes may be any codes that reduce and/or minimize the number of reading operations performed with reference to threshold voltages between threshold voltage distributions.

Figure 5:
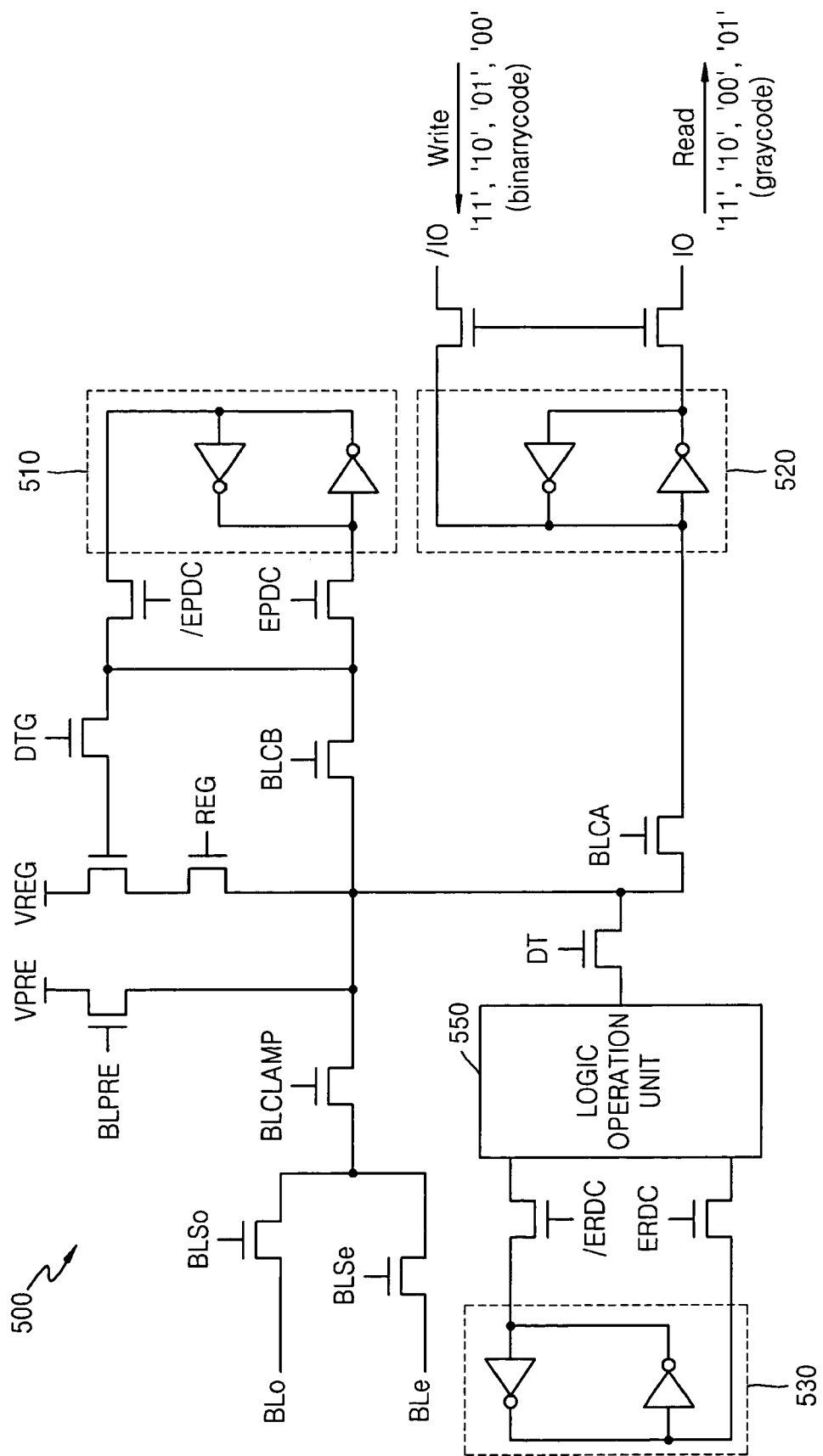
FIG. 5 is an example circuit diagram of an example embodiment of a page buffer.

FIG. 5 is an example circuit diagram of an example embodiment of a page buffer 500.

Referring to FIG. 5, the page buffer 500 includes a first latch 510, a second latch 520, a third latch 530, and a logic operation unit 550.

The first latch 510 stores the one bit obtained by the first reading operation ① described above with respect to FIG. 4. The second latch 520 stores the result of the first operation of the second reading operation described above with respect to FIG. 4. The third latch 530 stores the result of the second operation of the second reading operation described above with respect to FIG. 4. The logic operation unit 550 logically operates the result of the reading obtained with reference to the second threshold voltage VTH2 and the result of reading obtained with reference to the third threshold voltage VTH3. As such, the logic operation unit 550 obtains another bit of written data according to an example embodiment. Accordingly, the page buffer 500 according to an example embodiment may read a few bits, for example, the two most significant bits, by using reading codes from among a plurality of bits of the data written by using writing codes.

The logic operation unit 550 may perform an XOR operation and then invert the result of the XOR operation according to an example embodiment.

Figure 6A:
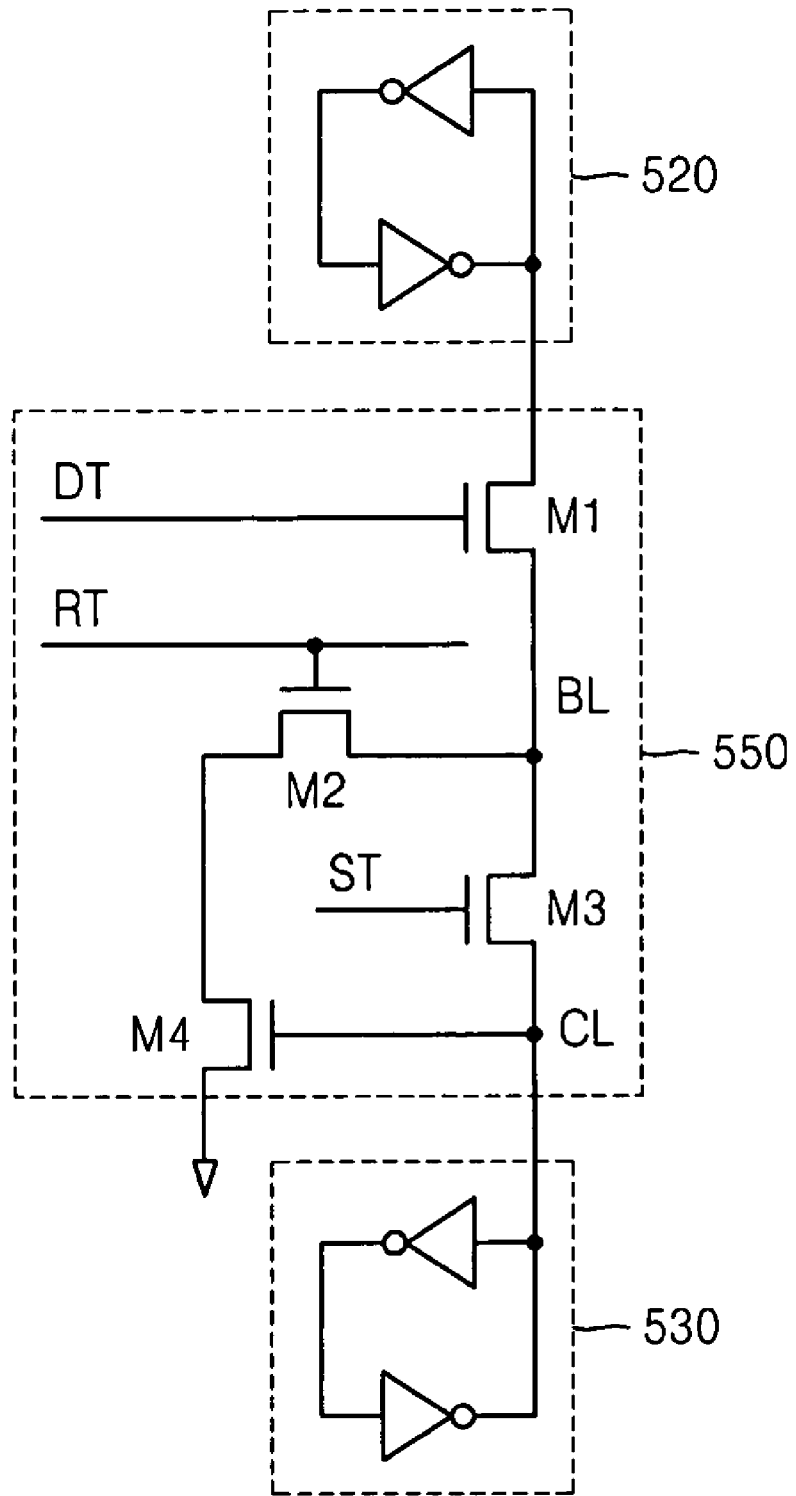
FIG. 6A is an example circuit diagram of a logic operation unit of the page buffer illustrated in FIG. 5.
Figures 6B, 6C:
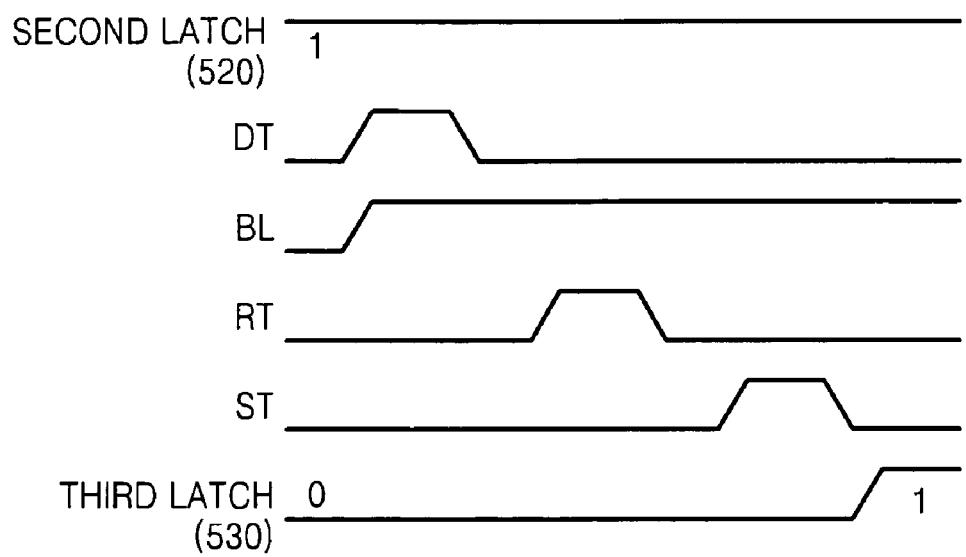
FIG. 6B is an example timing diagram for explaining an operation of the logic operation unit illustrated in FIG. 6A according to an example embodiment.
FIG. 6C is a logic table of logic statuses of second and third latches of the logic operation unit illustrated in FIG. 6A according to an example embodiment.

FIG. 6A is an example circuit diagram of the logic operation unit 550 illustrated in FIG. 5 according to an example embodiment. In FIG. 6A, for convenience of explanation, the second and third latches 520 and 530 are also illustrated. FIG. 6B is an example timing diagram for explaining an operation of the logic operation unit 550 illustrated in FIG. 6A according to an example embodiment.

Referring to FIGS. 6A and 6B, the logic operation unit 550 performs an XOR operation on values stored in the second latch 520 and the third latch 530, and inverts the result of the XOR operation. The inverted result of the XOR operation is stored in the third latch 530.

The timing diagram of FIG. 6B illustrates the first, second, and third signals DT, RT, and ST of the logic operation unit 550 sequentially transition from logic low to logic high.

Referring to the example circuit diagram of FIG. 6A, assuming that '1' is stored in the second latch 520 and '0' is stored in the third latch 530, as the first signal DT transitions to logic high, a first transistor M1 is activated and thus, a first node BL has a logic high level. Next, as the second signal RT transitions to logic high, a second transistor M2 is activated. Meanwhile, since '0' is stored in the third latch 530, a second node CL has a logic low level and thus, a fourth transistor M4 is deactivated. Then, as the third signal ST transitions to logic high, a third transistor M3 is activated and the second node CL has the logic high level under the influence of the first node BL having the logic high level. As a result, the value stored in the third latch 530 is changed from '0' to '1' according to this example.

Again referring to the example circuit diagram of FIG. 6A, assuming that '1' is stored in the second and third latches 520 and 530, as the first signal DT transitions to logic high, the first transistor M1 is activated and thus, the first node BL has the logic high level. Next, as the second signal RT transitions to logic high, the second transistor M2 is activated. Meanwhile, since '1' is stored in the third latch 530, the second node CL has the logic high level and thus, the fourth transistor M4 is activated. When the second and fourth transistors M2 and M4 are activated, a current path is generated from the first node BL to a ground so that the first node BL transitions from the logic high level to the logic low level. Then, as the third signal ST transitions to logic high, the third transistor M3 is activated and the second node CL transitions from the logic high level to the logic low level under the influence of the first node BL having the logic low level. As a result, the value stored in the third latch 530 is changed from '1' to '0' according to this example.

FIG. 6C is a logic table of logic statuses of the second and third latches 520 and 530 illustrated in FIG. 6A according to an example embodiment.

Referring to FIG. 6C, the logic table shows values stored in the second latch 520, values stored in the third latch 530, and values obtained by performing an XOR operation on the values of the second latch 520 and the values of the third latch 530 and inverting the results of the XOR operation. The inverted results of the XOR operation are re-stored in the third latch 530.

Figure 7:
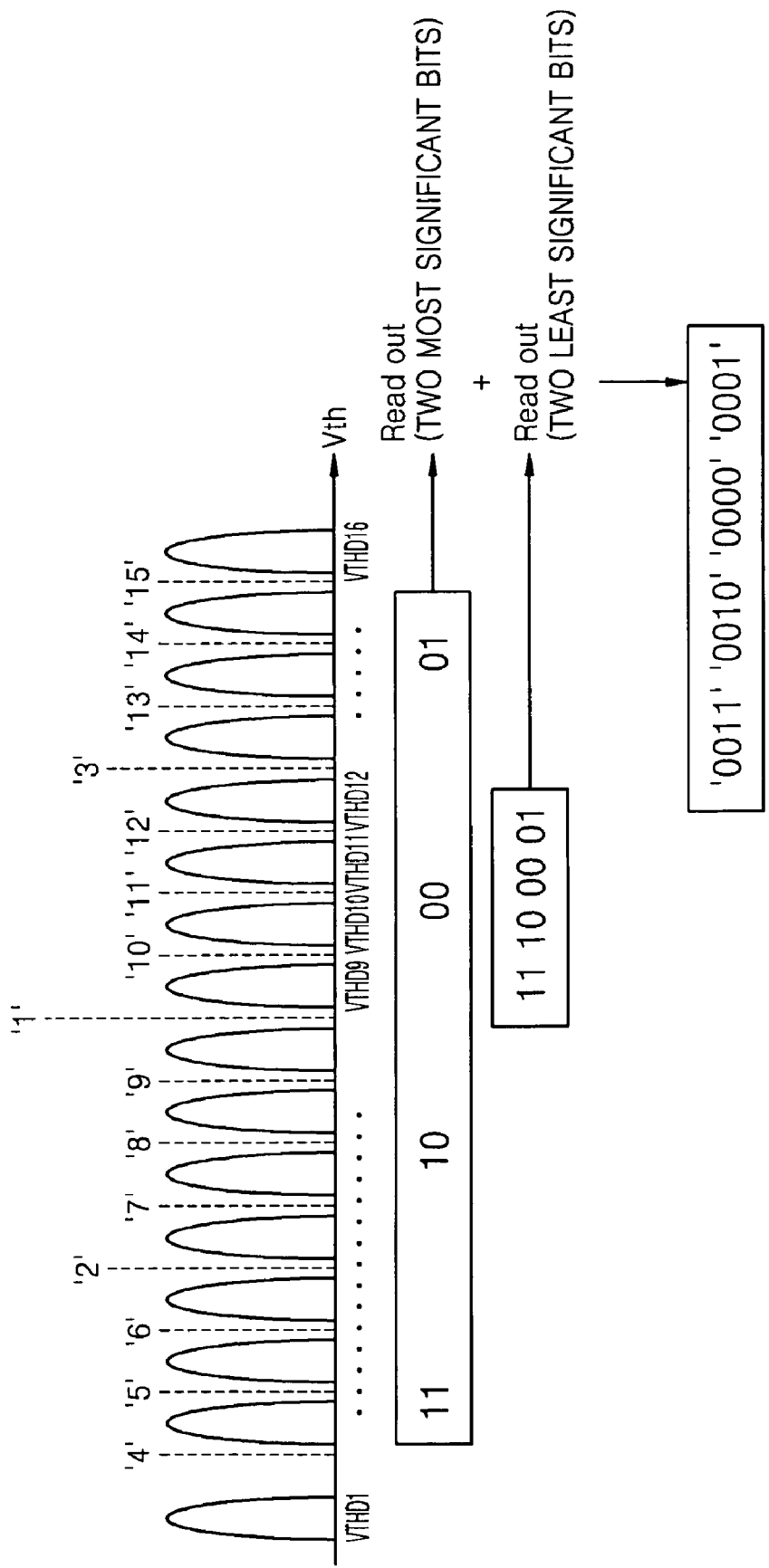
FIG. 7 is an example diagram illustrating an example embodiment of a method of writing/reading data into/from a memory cell having sixteen threshold voltage distributions.

FIG. 7 is an example diagram for describing an example embodiment of a method for writing/reading data into/from a memory cell having sixteen threshold voltage distributions.

Referring to FIG. 7, firstly, the two most significant bits are read out from among four-bit data stored in the memory cell by performing the method of writing/reading data into/from a memory cell as previously described with respect to FIGS. 3 through 6. Next, the two least significant bits are read out by re-performing the method for writing/reading data into/from a memory cell as described with respect to FIGS. 3 through 6, using threshold voltage distributions corresponding to the two most significant bits.

For example, assuming that the memory cell is written to have a tenth threshold voltage distribution VTHD10, by performing reading operations with respect to '1', '2', and '3' of FIG. 3, it is checked that the memory cell has one of ninth through twelfth threshold voltage distributions VTHD9 through VTHD12. That is, the two most significant bits of the memory cell are '00'. Next, by performing reading operations with respect to '10', '11', and '12' using the ninth through twelfth threshold voltage distributions VTHD9 through VTHD12, it is checked that the memory cell has the tenth threshold voltage distribution VTHD10. That is, the two least significant bits are '10' in this example. Lastly, by combining the two most significant bits and the two least significant bits, the data of the memory cell is read as '0010'.

Furthermore, an example embodiment of a method for writing/reading data into/from a memory cell may be used when n-bit data is read from the memory cell. That is, the reading operation of two bits is repeated until n bits of the data are completely read from the memory cell according to an example embodiment.

Figure 8:
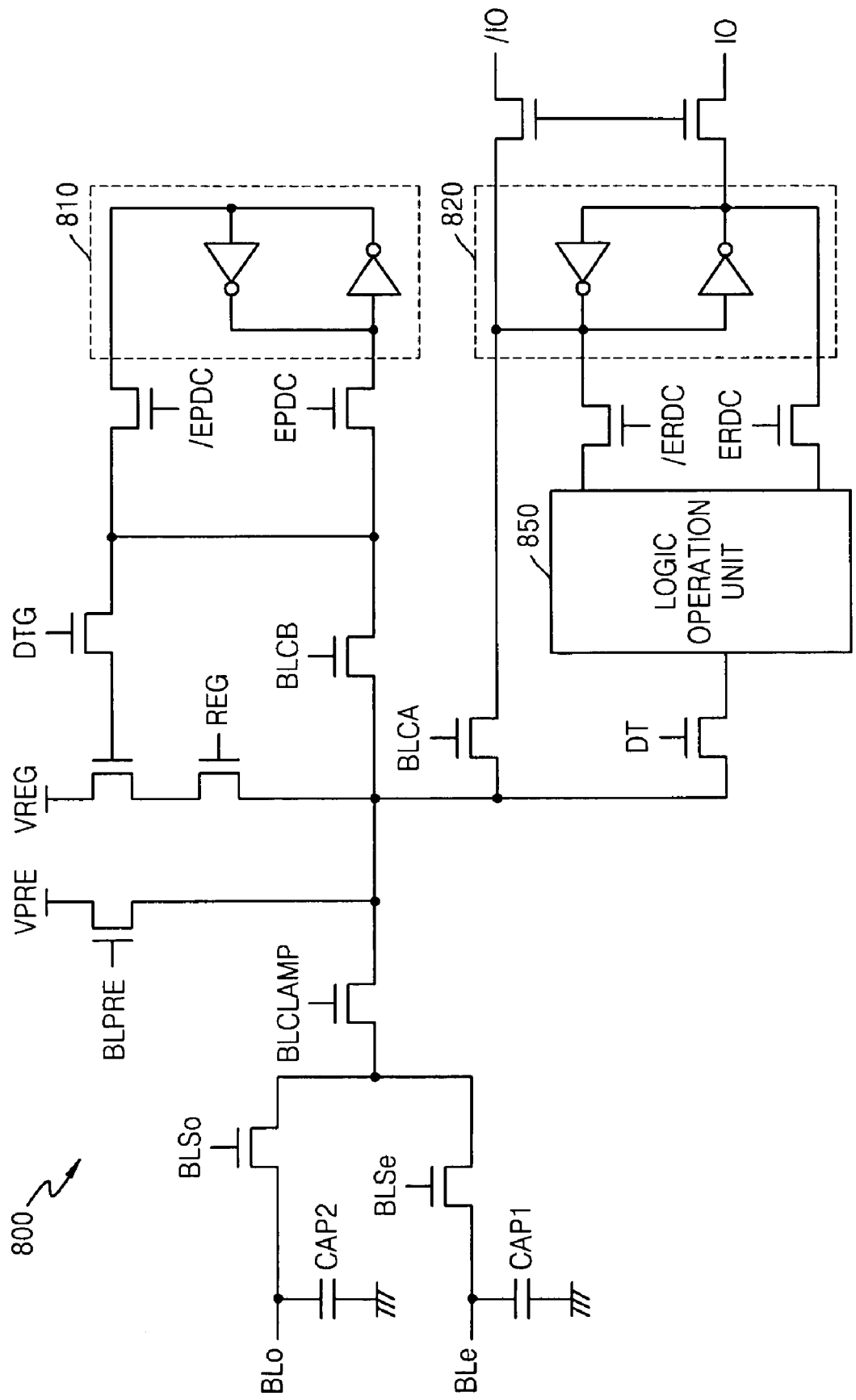
FIG. 8 is an example circuit diagram of a page buffer according to another embodiment.

FIG. 8 is an example circuit diagram of a page buffer 800 according to another example embodiment.

Referring to FIG. 8, the page buffer 800 includes a first latch 810, a second latch 820, and a logic operation unit 850. However, the page buffer 800 does not include an element corresponding to the third latch 530 illustrated in FIG. 5. Capacitors CAP1 and CAP2 formed on bit lines BLe and Blo, respectively, are used instead of the third latch 530 illustrated in FIG. 5. That is, results of reading obtained with reference to a third threshold voltage are stored in the capacitors CAP1 and CAP2 formed on the bit lines BLe and BLo.

As described above, according to the example embodiment described in this disclosure using different codes for writing and reading operations, the codes may be separately optimized for the writing and reading operations.

While example embodiments have been particularly shown and described with reference to the drawings, it will be understood by those of ordinary skill in the art that various changes in form and details may be made therein without departing from the spirit and scope of this disclosure. Example embodiment described herein should be considered in a descriptive sense only and not for purposes of limitation.

What is claimed is:

1. A method of writing/reading data into/from a memory cell that has a plurality of threshold voltage distributions within a voltage range, the method comprising:
   a data reading operation for reading data, which has a plurality of bits, from the memory cell with a plurality of reading codes corresponding to the plurality of threshold voltage distributions within the voltage range;
   a data writing operation for writing the data into the memory cell with the writing codes corresponding to the threshold voltage distributions within the voltage range; and
   converting the data read by the data reading operation using the writing codes,
   wherein the reading codes are different from corresponding writing codes.

2. The method of claim 1, wherein the data reading operation comprises:
   a first reading operation for reading one bit from the data written in the memory cell based on a first threshold voltage within the voltage range, the first threshold voltage being disposed in a middle of the voltage range;
   a second reading operation based on a second threshold voltage being disposed in a middle of a lower half of the voltage range and between voltage distributions of the lower half of the voltage range;
   a third reading operation based on a third threshold voltage being disposed in a middle of an upper half of the voltage range and between voltage distributions of the upper half of the voltage range; and
   a logic operation for obtaining another bit from the data written in the memory cell by performing a logic operation on results from the second reading operation and the third reading operation.

3. The method of claim 2, wherein the one bit is a most significant bit from the plurality of bits and the another bit is a second most significant bit from the plurality of bits of the data.

4. The method of claim 2, wherein other bits other than the one bit and the another bit read are obtained by re-performing the data reading operation using other threshold voltages disposed between voltage distributions within the voltage range.

5. The method of claim 4, wherein the data reading operation is repeated until all of the plurality of bits of the data are obtained.

6. The method of claim 2, wherein a number of the threshold voltage distributions is four, the data written in the memory cell includes two bits, the one bit is the most significant bit of the data written in the memory cell, and the other bit is the least significant of the data written in the memory cell.

7. The method of claim 2, wherein the number of the threshold voltage distributions is sixteen, the data written in the memory cell includes four bits, the two most significant bits of the data written in the memory cell is read by performing the data reading operation, and the two least significant bits of the data written in the memory is read by re-performing the data reading operation.

8. The method of claim 2, wherein the logic operation comprises:
   performing an exclusive or (XOR) operation on results of the second reading operation and the third reading operation, and
   inverting a result of the XOR operation.

9. The method of claim 2, further comprising:
   latching the one bit, wherein the latched bit is output together with the other bit after the other bit is obtained.

10. The method of claim 1, wherein the writing codes minimize threshold voltage variations for writing the data into the memory cell and the reading codes minimize the number of reading operations performed with reference to threshold voltages between the threshold voltage distributions.

11. The method of claim 1, wherein the writing codes are binary codes and the reading codes are gray codes.

12. The method of claim 1, wherein the memory cell is a multi-level flash memory.

13. The method of claim 1, wherein the memory cell includes $2^n$ threshold voltage distributions with the voltage range, the threshold voltage distributions being divided with reference to threshold voltages disposed between the threshold voltage distributions.

14. A page buffer of a semiconductor device which writes/reads data, which has a plurality of bits, into/from one or more memory cells each storing the data and having a plurality of threshold voltage distributions within a voltage range, the page buffer comprising:

a first latch for storing one bit of the plurality of bits of the data read from a memory cell with reference to a first threshold voltage disposed in the middle of the voltage range;

a first storing component for storing a result of reading from the memory cell with reference to a second threshold voltage disposed in a lower half of the voltage range and between threshold voltage distributions, the second threshold voltage being lower than the first threshold voltage;

a second storing component latch for storing a result of reading from the memory cell with reference to a third threshold voltage disposed in an upper half of the voltage range and between threshold voltage distributions, the third threshold voltage being larger than the first threshold voltage; and a logic operation unit for obtaining another bit of the data by performing a logic operation on results stored in the second latch and the third latch.

15. The page buffer of claim 14, wherein
the first storing component is a second latch and the second storing component is a second latch, and
if the data is to be written into one of the memory cells, the first latch receives and latches a kth bit to be written into the memory cell, k being a natural number, and then outputs the kth bit, the second latch receives and latches a k+1th bit to be written into the memory cell, and then outputs the k+1th bit, and the k+1th bit latched in the second latch is written into the memory cell with reference to the kth bit latched in the first latch.

16. The page buffer of claim 14, wherein the logic operation unit performs an exclusive or (XOR) operation and inverts the result of the XOR operation.

17. The page buffer of claim 14, wherein the page buffer outputs the one bit and the another one bit.

18. The page buffer of claim 14, wherein the one bit is a most significant bit of the data and the another bit is a second most significant bit of the data.

19. The page buffer of claim 14, wherein the first storing component and the second storing component are capacitors.

* * * * *